US009857550B2

(12) United States Patent
Cahall (10) Patent No.: US 9,857,550 B2
(45) Date of Patent: Jan. 2, 2018

(54) METHOD FOR REDUCING THE EFFECTS OF ELEMENT MISALIGNMENT IN AN OPTICAL SYSTEM

(71) Applicant: Moondog Optics, Inc., Fairport, NY (US)

(72) Inventor: Scott C. Cahall, Fairport, NY (US)

(73) Assignee: Moondog Optics, Inc., Fairport, NY (US)

(*) Notice: Subject to any disclaimer, the term of this patent is extended or adjusted under 35 U.S.C. 154(b) by 689 days.

(21) Appl. No.: 14/299,140

(22) Filed: Jun. 9, 2014

(65) Prior Publication Data

US 2014/0288904 A1    Sep. 25, 2014

Related U.S. Application Data

(62) Division of application No. 12/673,208, filed as application No. PCT/US2008/073146 on Aug. 14, 2008, now Pat. No. 8,773,784.

(60) Provisional application No. 60/955,692, filed on Aug. 14, 2007.

(51) Int. Cl.
| | | |
|---|---|---|
| G06G 7/48 | (2006.01) |
| G02B 7/02 | (2006.01) |
| G01M 11/02 | (2006.01) |
| G02B 7/00 | (2006.01) |
| G02B 27/62 | (2006.01) |
| G06F 17/50 | (2006.01) |
| G02B 7/04 | (2006.01) |
| G02B 7/10 | (2006.01) |
| G02B 9/12 | (2006.01) |
| G02B 13/00 | (2006.01) |

(52) U.S. Cl.
CPC .......... *G02B 7/02* (2013.01); *G01M 11/0221* (2013.01); *G02B 7/003* (2013.01); *G02B 13/0035* (2013.01); *G02B 27/62* (2013.01); *G06F 17/5009* (2013.01); *G02B 7/04* (2013.01); *G02B 7/10* (2013.01); *G02B 9/12* (2013.01); *G02B 13/001* (2013.01)

(58) Field of Classification Search
None
See application file for complete search history.

(56) References Cited

U.S. PATENT DOCUMENTS 7,738,175 B2 * 6/2010 Steenblik .................. B44F 1/10
359/619

* cited by examiner

*Primary Examiner* — Cedric D Johnson
(74) *Attorney, Agent, or Firm* — Thomas B. Ryan, Patent Agent; Harter Secrest & Emery LLP (57) ABSTRACT

Different rotational interfaces between individual optical components and their mounts are compared based on a sensitivity of optical system performance to misalignment of the optical component to an alignment axis of the optical mount within a clearance space. The rotational interfaces at which the sensitivity of the optical system performance to the misalignment of the optical component approaches a minimum are incorporated into the optical design.

25 Claims, 10 Drawing Sheets

METHOD FOR REDUCING THE EFFECTS OF ELEMENT MISALIGNMENT IN AN OPTICAL SYSTEM

CROSS-REFERENCE TO RELATED APPLICATIONS

This application is a divisional application of nonprovisional U.S. application Ser. No. 12/673,208, filed Feb. 12, 2010 as a §371 national stage application of International Application No. PCT/US2008/073146 filed Aug. 14, 2008 claiming the benefit of U.S. Provisional Application No. 60/955,692, filed on Aug. 14, 2007.

TECHNICAL FIELD

The invention relates to optical assemblies for optical systems and particularly to mounting systems for components of such assemblies whose optical performance is sensitive to misalignment of the components.

BACKGROUND OF THE INVENTION

As with manufactured goods in general, the components of optical assemblies are manufactured within tolerances that allow for some variability within the completed optical assemblies of a particular nominal design due to variations in the components and in the positioning and orientation of the components with respect to one another. The effect of such variability, as deviations from an optimum design, can vary from optical assembly to optical assembly such that the optical performance of some optical assemblies can be significantly lower than the performance of other optical assemblies whose components are manufactured to the same tolerances.

Misalignment errors in optical assemblies can significantly degrade the optical performance of the optical assemblies. Such misalignments in imaging systems can produce variations in image quality across an image plane and reduce focal depth normal to the image plane. The misalignments, which generally disrupt the symmetry of the optical systems, are generally not offset by other errors in the optical systems.

In addition, misalignment errors tend to be more difficult to control than other types of errors because the misalignments generally occur at interfaces between components and their mounts. Variations in either the components or their mounts can affect the alignment of the components with respect to their mounts. Even within components and mounts manufactured to optimum nominal dimensions, clearance required for such purposes as facilitating of assembly, accommodating dimensional changes due to temperature variations, or accommodating the prescribed tolerance ranges allows for some variability in the positioning or orientation of the components within the optical assembly.

For optimum alignment, the optical axes of the components must be aligned with the alignment axis of the optical assembly. Lateral shifts of component axes with respect to an alignment axis of the optical assembly are referred to as "decenter" misalignments, and angular departures of the component axes with respect to the alignment axis are referred to as "tilt" misalignments.

Planar mounting interfaces between components and their mounts generally permit decentering of the components throughout the clearance space, such as between the outer diameters of lenses and the inner diameters of barrel surfaces within which the lenses are mounted. Mounts that engage spherical optical surfaces of the components, including spherical extensions of the optically functional zones of the optical surfaces, exploit coincidences with the mounted optical surfaces but still produce both decenter and tilt misalignments for the opposite side optical surfaces. Separately or in combination, decenter and tilt misalignments can produce a number of aberrations including astigmatic, comatic, and higher order aberrations.

SUMMARY OF THE INVENTION

The invention, among certain of its preferred embodiments, optimizes rotational interfaces between the components and their mounts to reduce the deleterious effects of component misalignments tolerated by the clearance spaces within optical assemblies. Independently of any curvatures that may be exhibited by optically functional features of the components, an optimization routine identifies locations for centers of curvature of the rotational interfaces at which the optical performances of the optical assemblies are least sensitive to misalignment of the components. The design optimization can be used to improve system performance, increase manufacturing yields, avoid additional adjustments or requirements for active alignment of components, and reduce manufacturing costs. The effects of tighter alignment tolerances can be achieved without tightening the manufacturing tolerances of the components or their mounts within the optical assemblies.

One version of the invention can be expressed as a mounting system for mounting an optical component with respect to an optical mount within an optical system. The optical component has an optical axis and one or more optically functional surfaces. The optical mount has an alignment axis. Lateral departures of the optical axis of the optical component from the alignment axis of the optical mount define decenter misalignments. Angular departures of the optical axis of the optical component from to the alignment axis of the optical mount define tilt misalignments. A rotational interface formed between the optical component and the optical mount defines a path of relative motion for the optical component with respect to the optical mount about a center of curvature. A clearance constraint limits the path of relative motion of the optical component with respect to the optical mount to angular positions about the center of curvature of the rotational interface at which the one or more optical surfaces of the optical component undergo misalignments. The center of curvature of the rotational interface is located along the alignment axis in a position at which sensitivity of optical system performance to the misalignments of the optical components approaches a minimum.

One or more optically functional surfaces can have base centers of curvature at the optical axis referenced to vertices of the optically functional surfaces or instant centers of curvature at the optical axis referenced to edges of optically functional zones of the optically functional surfaces. In both cases, the center of curvature of the rotational interface preferably departs from the referenced base or instant centers of curvature of the one or more optically functional surfaces along the alignment and optical axes by an amount that reduces sensitivity of optical system performance to misalignment of the optical component. Preferably, the center of curvature of the rotational interface is located along the alignment axis independently of the physical form of the optically functional surfaces apart from their optical contributions to the optical system.

The optical component preferably includes an optical zone containing the one or more optically functional surfaces and a mounting zone containing a land. The optical mount preferably includes a seat for engaging the land of the optical component. One or both of the land and the seat can form sectors of a sphere having a finite radius of curvature corresponding to the finite radius of curvature of the rotational interface. One or both of the land and the seat can include a discontinuous surface forming a plurality of limited areas of engagement with the other of the land and the seat. The seat can have a center of curvature that lies along the alignment axis of the optical mount coincident with the location of the center of curvature of the rotational interface. The seat can be formed in a barrel, a spacer, or a retainer within the optical system. Alternatively, the seat can be formed in the mounting zone of another optical component.

The land can have a center of curvature that lies along the optical axis of the optical component. The land of the mounting zone can be formed as a continuation of one of the optical surfaces of the optical zone as a part of a common surface having different local nominal radii of curvature within the two different zones. The land of the mounting zone and one of the optical surfaces of the optical zone can be formed as different parts of a continuous aspheric surface.

The optically functional surfaces can include one or more of a refractive surface, a diffractive surface, and a reflective surface. The mounting zone of the optical component can include an adapter affixed to the optical zone of the optical component, and the land can be formed on the adapter. The seat of the optical mount is preferably fixed within the optical mount. However, the optical mount can be translatable within the optical assembly, such as for focusing or zooming a lens. The optical component itself can include an assembly of optical elements such as a plurality of lenses.

Another version of the invention features a design method for reducing sensitivity of optical system performance to misalignment of an optical component within an optical assembly. A mathematically defined model is created of an optical system within which a rotational interface between the optical component and an optical mount has a center of curvature about which the optical component is pivotable with respect to the optical mount. A merit function is established to assess the optical system performance of the optical assembly. A dimension of the rotational interface is arranged as a variable within the model of the optical assembly. A simulation is performed of angular misalignments of the optical component with respect to the optical mount about the center of curvature of the rotational interface. The merit function is then evaluated for different values of the rotational interface dimension, preferably with correspondingly different values of potential angular misalignment through a common clearance space. One or more values of the rotational interface dimension are identified at which the optical system performance of the optical assembly is less adversely affected by misalignment of the optical component within the clearance space according to the merit function.

Preferably, the values of the rotational interface dimension correspond to locations of the center of curvature of the rotational interface. As such, the center of curvature of the rotational interface is allowed to vary along an alignment axis of the optical mount for comparing the locations according to the merit function.

Different angular misalignments can be based on a clearance constraint that limits the angular misalignment of the optical component with respect to the optical mount about the center of curvature of the rotational interface. For example, given an assumed lateral constraint (e.g., the boundary of a clearance space), each value of the center of curvature of the rotational interface dimension results in a correspondingly different angular misalignment at the constraint. Mounting parameters between the optical component and the optical mount can be selected for adjusting the clearance constraint between the optical component and the optical mount. Based upon comparisons made according to the merit function, the one or more values of the rotational interface dimension can be identified at which the system performance approaches an optimized condition.

The merit function can incorporate modulation transfer function targets, wavefront/optical path difference targets, or spot size targets. In addition, the merit function can incorporate targets and weights for a plurality of parameters that collectively provide an indication of a suitability of the optical system for an intended use. A prescription of the optical system can remain fixed for optimizing the rotational interface dimension according to the merit function. Alternatively, the prescription of the optical system can be optimized together with the rotational interface dimension according to the merit function, or the prescription of the optical system can be optimized based on the one or more identified values of the rotational interface dimension that was previously selected according to the merit function.

Yet another version of the invention features a method of dimensioning a zone of engagement between an optical component and an optical mount within an optical system. An optimization routine is performed in which different rotational interfaces between an optical component and an optical mount are compared based on a sensitivity of optical system performance to misalignment of the optical component to an alignment axis of the optical mount within a clearance constraint. A selection is made among the different rotational interfaces at which the sensitivity of the optical system performance to misalignment of the optical component within a clearance constraint approaches a minimum. A zone of engagement between the optical component and the optical mount is dimensioned in accordance with the selected rotational interface.

Preferably, the misalignments of the optical component correspond to angular positions of the optical component about centers of curvature of the rotational interfaces. The different rotational interfaces can have centers of curvature that lie along the alignment axis of the optical mount and vary in location along the alignment axis with changes in the rotational interfaces.

Performing the optimization routine preferably includes establishing a merit function to assess the sensitivity of optical system performance to the misalignment of the optical component within a clearance constraint. The optimization routine also provides for simulating the angular misalignment of the optical component with respect to the optical mount about the center of curvature of the rotational interface and for evaluating the merit function at the simulated angular misalignment of the optical component for different values of the rotational interface dimension. The simulated angular misalignment itself is preferably a function of both the location of the center of curvature of the rotational interface and a clearance space through which the optical component can be displaced.

DETAILED DESCRIPTION OF THE INVENTION

Figure 1:
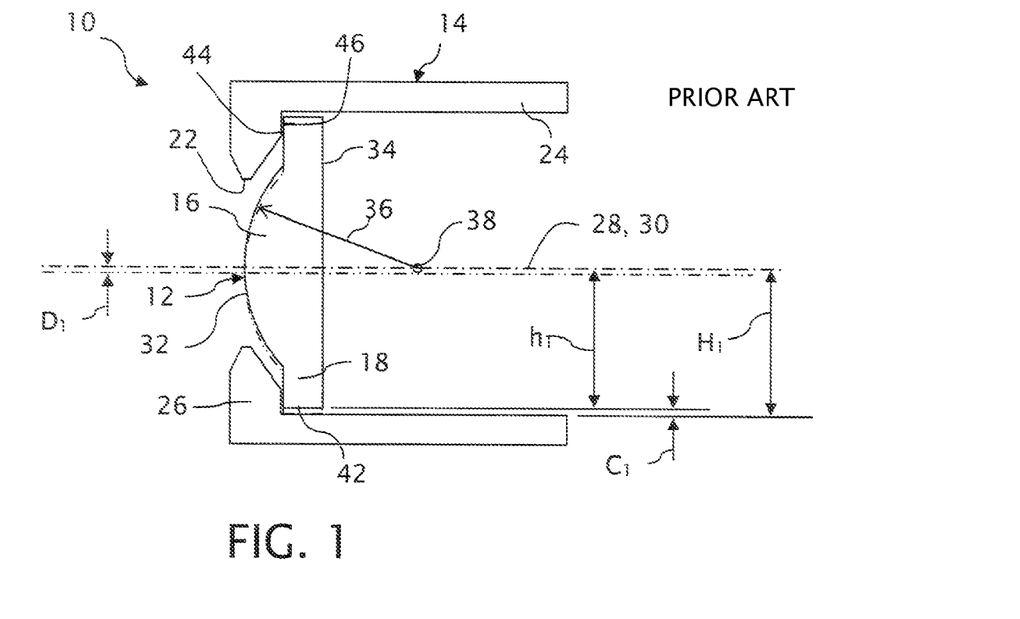
FIG. 1 is a schematic side view of a conventional optical assembly within which an optical element undergoes a decenter misalignment through a clearance space.

A simplified conventional optical assembly 10 as shown in FIG. 1 includes a single optical element 12 positioned in engagement with an optical mount 14. The optical element 12 includes an optically functional zone 16 nominally centered within the optical mount 14 and a mounting zone 18 that extends radially beyond the optically functional zone 16. An aperture 22 of the optical mount 14 is formed within an annular support ring 26, which projects from a barrel-shaped body 24 of the optical mount 14, all centered about an alignment axis 28.

The optically functional zone 16 includes anterior and posterior optical surfaces 32 and 34 centered about an optical axis 30 of the optical element 12, shown in FIG. 1 coincident with the alignment axis 28 of the optical mount 14. The anterior surface 32 has a finite radius of curvature 36 extending from a center of curvature 38. The posterior surface 34 is flat and, as such, has an infinite radius of curvature (not shown). The mounting zone 18 includes, in addition to an outer peripheral surface 42, a planar land 44 as an extension of the anterior surface 32. The annular ring 26 of the optical mount 14 includes a planar seat 46 that engages the planar land 44 of the optical element 12 to position the optical element 12 within the optical mount 14.

Overall, the optical element 12 has an outside radius "$h_1$", and the barrel-shaped body 24 of the optical mount 14 has an inside radius "$H_1$" that is larger than the outside radius "$h_1$" of the optical element 12 by a clearance space "$C_1$". The planar seat 44 of the optical mount 14 engages the planar land 42 of the optical element 12 to locate the optical element 12 along the alignment axis 28 of the optical mount 14. However, the clearance space "$C_1$", which is required to facilitate assembly and to accommodate assembly tolerances, allows a lateral translation of the optical element 12 with respect to the optical mount 14 in any transverse direction normal to the alignment axis 28 through the radial distance of the clearance space "$C_1$". As a result, the optical element 12 can be laterally displaced, as shown in phantom line, which produces a decenter misalignment "$D_1$" (="$C_1$", for the case shown here) referenced from the alignment axis 28. Such decenter misalignments "$D_1$" can significantly degrade optical performance.

Figure 2:
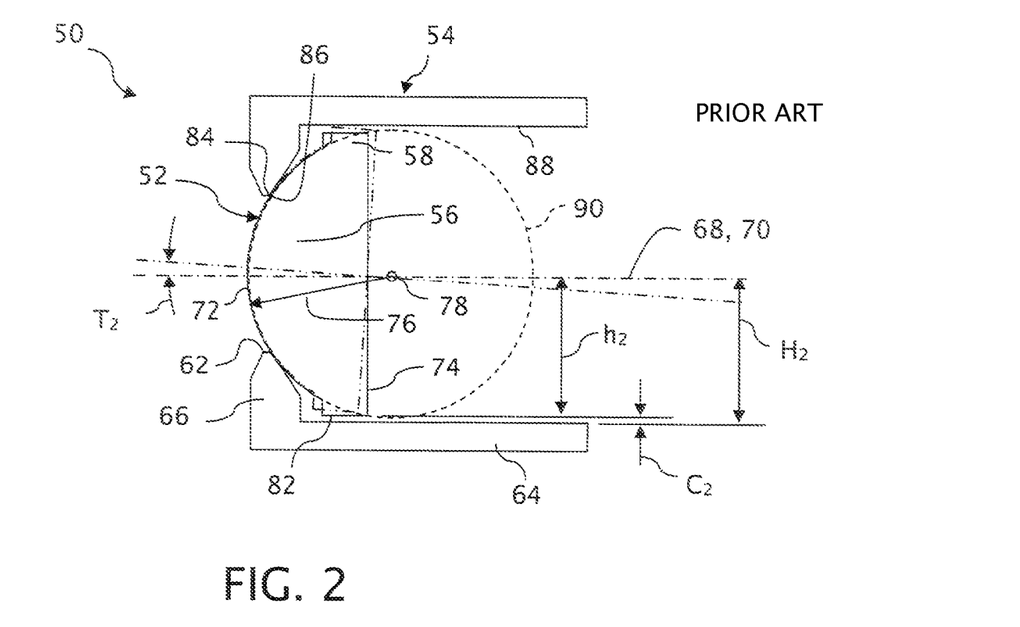
FIG. 2 is a schematic side view of another conventional optical assembly within which an optical element undergoes a pivot (roll), which effectively includes both a decenter and a tilt, through a clearance space.

Another simplified conventional optical assembly 50 as shown in FIG. 2 includes a single optical element 52 positioned in engagement with an optical mount 54. Similar to the optical element 12 of the optical assembly 50, the optical element 52 includes an optically functional zone 56 nominally centered within the optical mount 54 but in place of the mounting zone 18 includes an extended zone 58 that extends radially beyond the optically functional zone 56. An aperture 62 of the optical mount 54 occupies a space within an annular support ring 66 of a barrel-shaped body 64 of the optical mount 54, all centered about an alignment axis 68.

The optically functional zone 56 includes anterior and posterior optical surfaces 72 and 74 centered about an optical axis 70 of the optical element 52, shown in FIG. 2 coincident with the alignment axis 68 of the optical mount 54. The anterior surface 72 has a finite radius of curvature 76 extending from a center of curvature 78. The posterior surface 74 is flat and, as such, has an infinite radius of curvature (not shown). The extended zone 58 includes a peripheral surface 82 at an outside radius "$h_2$" from the optical axis 70 that fits within an interior surface 88 of the barrel-shaped body 64 at an inside radius "$H_2$" measured from the alignment axis 68.

The annular ring 66 of the optical mount 14 includes a rim seat 84 that engages an annular portion 86 of the anterior optical surface 72 of the optical element 52 to position the optical element 52 within the optical mount 45. Together, the rim seat 84 of the support ring 66 and the annular portion 86 of the anterior optical surface 72 form a spherical rotational interface 90 centered about the center of curvature 78 of the anterior optical surface 72. The rotational interface 90 locates the center of curvature 78 of the anterior optical surface 72 along the alignment axis 68. However, a clearance space "$C_2$", measured as a radial difference between the outside radius "$h_2$" of the optical element 52 and the inside radius "$H_2$" of the optical mount 54, allows limited rotation of the optical element 52 with respect to the optical mount 54 in any angular direction about the center of curvature 78 along an arcuate pathway through the clearance space "$C_2$". As a result, the optical element 52 can be angularly displaced, as shown in phantom line, which produces a pivot (roll) misalignment "$T_2$" referenced from the alignment axis 68 about the center of curvature 78. Although such pivot (roll) misalignments "$T_2$" may have little adverse affect on the optical performance due to the anterior surface 72 (to the extent that the anterior surface 72 is itself spherical overlaying a homogenous refractive index), such pivot (roll) misalignments can unfavorably misalign the posterior surface 74 and thereby significantly degrade overall optical performance.

Figure 3:
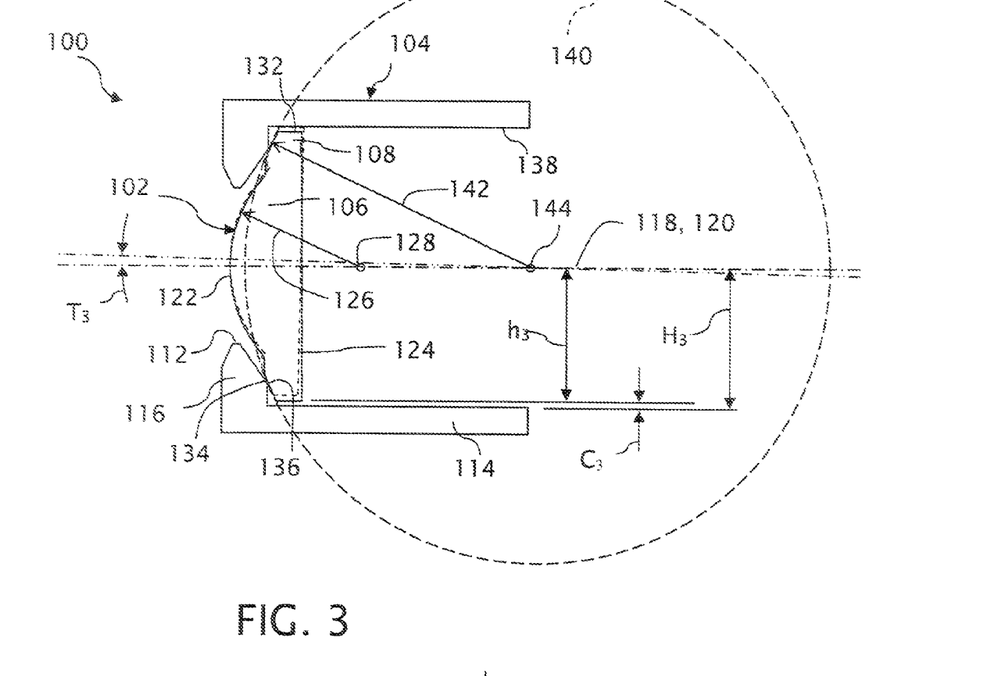
FIG. 3 is a schematic side view of an optical assembly adapted for purposes of the invention to include a specially dimensioned rotational interface between an optical element and its optical mount.

Another simplified optical assembly 100 specially arranged to accommodate limited misalignments of an optical element 102 within an optical mount 104 through a clearance space "$C_3$" is shown in FIG. 3. The optical element 102 includes an optically functional zone 106 nominally centered within the optical mount 104 and a mounting zone 108 that extends radially beyond the optically functional zone 106. An aperture 112 of the optical mount 104 occupies a space within an annular support ring 116 of a barrel-shaped body 114 of the optical mount 104, all centered about an alignment axis 118.

The optically functional zone 106 includes anterior and posterior optical surfaces 122 and 124 centered about an optical axis 120 of the optical element 102, shown in FIG. 3 coincident with the alignment axis 118 of the optical mount 104. The anterior surface 122 has a finite radius of curvature 126 extending form a center of curvature 128. (Note: The anterior surface 122 is depicted as a spherical surface but could also take other forms such as an aspheric surface; therefore, a base center of curvature measured at the surface vertex can be referenced as the center of curvature of all considered surfaces.) The posterior surface 124 is flat and, as such, has an infinite radius of curvature (not shown). The mounting zone 108 includes a spherical land 134 as an extension of the anterior surface 122. The support ring 116 of the optical mount 104 includes a rim seat 136 that engages the spherical land 134 of the optical element 102 along a line of contact to position the optical element 102 with the optical mount 104.

Together, the rim seat 136 of the support ring 116 and the spherical land 134 of the mounting zone 108 form a zone of engagement defined by a spherical rotational interface 140 having a unique center of curvature 144 located along the alignment axis 118. The rotational interface 140, which has a radius of curvature 142, allows a limited relative rotation of the optical element 102 with respect to the optical mount 104 about the center of curvature 144 through the clearance space "$C_3$"

The clearance space "$C_3$" is measured as a radical distance between an outer periphery 132 of the optical element 102 having an outside radius "$h_3$" and an interior surface 138 of the barrel-shaped body 114 of the optical mount 104 having an inside radius "$H_3$". The clearance space "$C_3$" allows limited rotation of the optical element 102 with respect to the optical amount 104 in any angular direction about the center of curvature 144 along an arcuate pathway through the clearance space "$C_3$". As a result, the optical element 102 can be angularly displaced, as shown in phantom line, which produces a pivot (roll) misalignment "$T_3$" referenced from the alignment axis 118 about the center of curvature 144. Such pivot (roll) misalignments produce decenter misalignment in addition to tilt misalignment because of the offset of the center of curvature 144 from the optical surfaces 122 and 124 of the optical element 102. The position of the center of curvature 144 of the rotational interface 140 is determined in accordance with the invention to minimize the adverse influence of the possible misalignments of the optical element 102 on optical system performance through the clearance space "$C_3$". As such, the center of curvature 144 of the rotational interface 140 is located along the alignment axis 118 independently of the location of the center of curvature 128 of the anterior surface 122 along the coincident optical axis 120.

Figure 4:
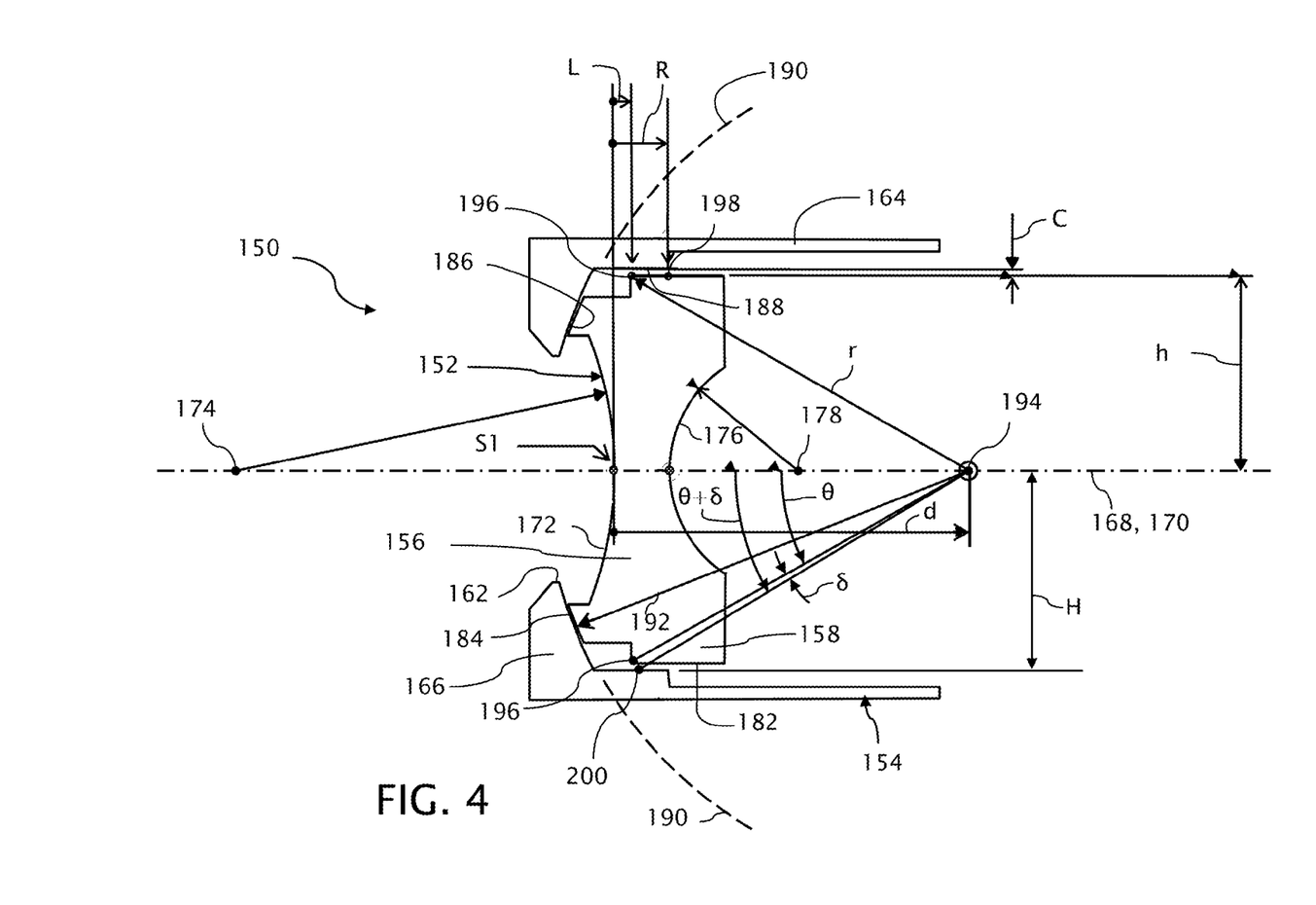
FIG. 4 is a relatively enlarged schematic side view of another optical assembly adapted for purposes of the invention with referenced dimensions associated with a desired rotational interface between an optical element and its optical mount.

With reference to FIG. 4, a preferred practice of the inventive method requires the determination of the angular misalignment "δ" through the clearance space "C" for a given optical assembly 150 and considered rotational interface 190. Again, for sake of simplicity, the optical assembly 150 includes a single optical element 152 positioned in engagement with an optical mount 154. The optical element 152 includes an optically functional zone 156 nominally centered within the optical mount 154 and a mounting zone 158 that extends radially beyond the optically functional zone 156. An aperture 162 of the optical mount 154 occupies a space within an annular support ring 166 of a barrel-shaped body 164 of the optical mount 154, all centered about an alignment axis 168.

The optically functional zone 156 includes anterior and posterior optical surfaces 172 and 176 centered about an optical axis 170 of the optical element 152, shown in FIG. 4 coincident with the alignment axis 168 of the optical mount 154. The anterior surface 172 has a finite radius of curvature extending from a center of curvature 174. The posterior surface 176 has a finite radius of curvature extending from a center of curvature 178. The mounting zone 158 includes a peripheral surface 182 at an outside radius "h" from the optical axis 170 that fits within an interior surface 188 of the barrel-shaped body 164 at an inside radius "H" measured from the alignment axis 168. The clearance space "C" is defined as a radial difference between the outside radius "h" of the optical element 152 and the inside radius "H" of the optical mount 154.

The mounting zone 158 includes a spherical land 184 as a discontinuous extension of the anterior surface 172. The support ring 166 of the optical mount 154 includes a mating spherical seat 186 that engages the spherical land 184 of the optical element 152 at points of sliding contact to position the optical element 152 within the optical mount 154. Together, the spherical seat 186 of the support ring 166 and the spherical land 184 of the mounting zone 158 form a zone of engagement defined by a spherical rotational interface 190 having a unique center of curvature 194 located along the alignment axis 168. The rotational interface 190, which has a radius of curvature 192, allows a limited relative rotation of the optical element 152 in any direction with respect to the optical mount 154 about the center of curvature 194 through the clearance space "C".

As a result, the optical element 152 can be angularly displaced through the clearance space "C" about the center of curvature 194 of the rotational interface 190 by the misalignment angle "δ", which is based on a number of variables defined as follows:

| Variable | Description |
| --- | --- |
| L | A distance along the optical axis 170 from a S1 vertex to a left-most point 196 on the peripheral surface 182 of the optical element 152 subject to contacting a point 200 on the interior surface 188 of the barrel-shaped body 164. If the point 196 (considered anywhere about the radially symmetric circumference of the optical element at the distance L) is located to the left of the vertex S1, the distance L is a negative value. Otherwise, the distance L is a positive value. |
| R | A distance along the optical axis 170 from the S1 vertex to a right most point 198 on the peripheral surface 182 of the optical element 152 subject to contacting the interior surface 188 at the barrel-shaped body, 164. If the point 198 (considered anywhere about the radially symmetric circumference of the optical element at the distance R) is located to the left of the vertex S1, the distance R is a negative value. Otherwise, the distance R is a positive value. |
| h | The radial distance from the optical axis 170 to the points 196 or 198 on the peripheral surface 182 of the optical element 152. |
| C | A radial distance through the clearance space between the peripheral surface 182 of the optical element 152 and an interior surface 188 of the barrel-shaped body 164. |
| d | A distance along the optical axis 170 from the S1 vertex to the center of curvature 194 of the rotational interface 190. The distance d is negative if the center of curvature 194 is to the left of the vertex S1 and positive if the center of curvature 194 is to the right of the vertex S1. |
| δ | A pivot (roll) angle of the optical element 152 about the center of curvature 194 ot the rotational interface 190 between a position at which the optical element 152 is centered along the alignment axis 168 and a position at which the optical element 152 is pivoted (rolled) into contact with the interior surface 188 of the barrel-shaped body 164 such as at the point 200. |
| $\delta_{MAX}$ | A maximum allowed pivot (roll) angle of the optical element 152 as set by a user to prevent a merit function from becoming incalculable such as for rotation points near the (L + R)/2 point. If the threshold is too low, preferred values of d may not be discovered. The threshold $\delta_{MAX}$ can be arbitrarily set to 0.1 deg (6 min) to start. In practice, appropriate/useful values for this threshold are determined on a case-by-case basis. |
| r | A radial distance from the center of curvature 194 of the rotational interface 190 to both the contact point 196 on the peripheral surface 182 of the optical element 152 and the corresponding contact point 200 on the interior surface 188 of the barrel-shaped body 164. A similar radius r is defined for centers of curvature 194 located on the opposite side of the optical element 152 to the contact point 198. |

All of the distances are indicated in the same set of units (such as mm). The choice of the S1 vertex as a reference point is arbitrary. Likewise, the use of a "C" that is precisely equal to the full clearance space is not a hard requirement. In practice, the use of other values approximately equal to or smaller than the clearance space have indicated similar values for optimal centers of curvature "d" for a given component of a given system. The distance "r" defines a radial distance shown in FIG. 4 from the center of curvature 194 to farthest point 196 on the outer periphery 182 of the optical element 152, which engages with the interior surface 188 of the optical mount 154. The distance "r" to the contact point 196 can be calculated as follows:

$$r=\sqrt{h^2+(d-L)^2}$$

Given the input values r, h, and C, a pivot (roll) angle "δ" can be calculated as follows:

$$\delta = -\left[\sin^{-1}\left(\frac{h+C}{r}\right) - \sin^{-1}\left(\frac{h}{r}\right)\right]$$

A different distance "r" is calculated for pivots (rolls about centers of curvature of the rotational interface to the left of a midpoint between the contact points 196 and 198, where:

$$d \le \left(\frac{L+R}{2}\right)$$

The different distance "r" is to the contact point 198 rather than to the contact point 196, and is calculated as follows:

$$r=\sqrt{h^2+(d-R)^2}$$

Given the input values r, h, and C, a pivot (roll) angle "δ" can be calculated as follows:

$$\delta = \left[\sin^{-1}\left(\frac{h+C}{r}\right) - \sin^{-1}\left(\frac{h}{r}\right)\right]$$

The opposite signs at the beginning of the expressions for "δ" force the component to move to the same side of the clearance regardless of the location of the center of curvature. While this may be convenient for visualization, in practice, this sign does not affect the value of the merit function or the selection of a center of curvature. If the resulting angle "δ" is greater than the threshold "$\delta_{MAX}$", the associated "d" values are excluded from consideration.

Given the ability to calculate the pivot (roll) angles "δ" for different distances "d" associated with the location of the center of curvature 194 of the rotational interface 190 between the optical element 152 and the optical mount 154, the invention in and among its preferred embodiments provides for assessing the optical performance of the optical assembly 150 at different rotational mounting distances "d" and for identifying the different rotational mounting distances "d" at which the optical design is less sensitive to the possible misalignment of the optical element 152 through the available clearance space "C".

Figure 5:
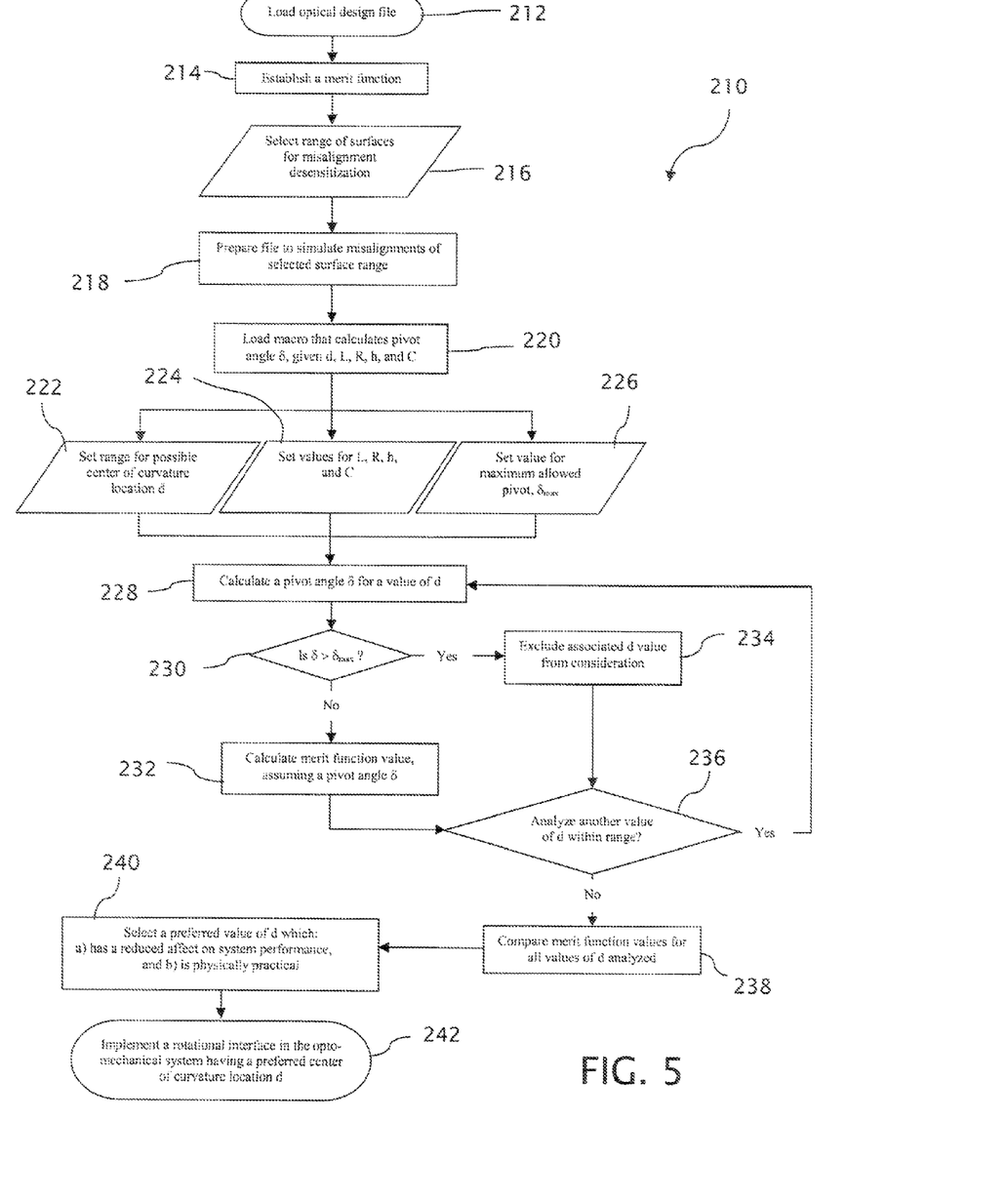
FIG. 5 is a flow chart of a method for achieving a desired rotational interface based on various input variables and parameters.

The flow chart 210 of FIG. 5 illustrates one example of this method for reducing the sensitivity of optical system performance to anticipated misalignments of an optical assembly such as the simplified optical assemblies 100 and 150 discussed above. At step 212, an optical design file is loaded for defining the optical characteristics of the optical system, generally in the form of prescription consistent with conventional optical design and analysis software such as Code V optical design software from Optical Research Associates of Pasadena, Calif., OSLO optical design software from Lambda Research Corporation of Littleton, Mass., and ZEMAX optical design software from ZEMAX Development Corp. of Bellevue, Wash. Typical inputs include the radii of curvature and refractive indices of the optical elements and their on-axis spacing.

Optical system performance of a given optical design can be assessed in a variety of ways depending largely upon the requirements and intended use of the design. Step 214 calls for the establishment of a merit function, also referred to in the art as an error function, for assessing system performance. Merit function criteria available for conventional optical design and analysis software include singly or combination:

Transverse ray errors (e.g., spot size) for pre-stored ray patterns.
Wavefront variance for pre-stored ray patterns
Modulation Transfer Function (MTF) at user-selected spatial frequencies for pre-stored ray patterns, or
User-defined quantities based on a user-defined ray patterns.

Merit functions can be created based on peak-to-valley or root mean square values and may reference chief rays or centroids of energy, when appropriate. Merit function criteria can also include such parameters as distortion, lateral chromatic aberration, bore sight error, Zernike coefficients, and many others. For non-imaging applications, merit functions may also include parameters such as encircled or ensquared energy or other similar metrics of efficiency or throughput. Various combinations of these possible criteria can include assigning different target values and weights to the individual criteria for establishing an overall merit function useful for rating the performance of an optical design in accordance with its intended end use.

At step 216, a group of optical surfaces within the optical design is selected for misalignment desensitization. The group of surfaces, which can be referred to more generally as an optical component, can range from a single optical surface to a set of optical elements that are pivotable together with respect to an optical mount via a defined rotational interface. Step 218 incorporates the rotational interface into the optical design, including the ability to pivot (roll) the selected group of surfaces with respect to the optical mount about the center of curvature 194. A macro incorporating the above equations is loaded at step 220 for calculating the pivot (roll) angle "δ" for given values of the variables "d", "L", "R", "h" and "C".

The three related steps 222, 224, and 226 provide for setting thresholds and given values for the variables including: (a) a range of possible locations for the center of curvature of the rotational interface according to the variable "d" at step 222, (b) given values for the variables "L", "R", "h", and "C" at step 224, and (c) a maximum allowed value for the pivot (roll) angle "$\delta_{MAX}$" at step 226. Based on an assumed value for "d" and the given values of the other variables "L", "R", "h", and "C", the corresponding pivot (roll) angle "δ" is calculated at step 228 using the loaded macro of step 220.

At decision step 230, the calculated value of pivot (roll) angle "δ" is compared to the threshold value of "$\delta_{MAX}$". If the value of pivot (roll) angle "δ" is less than or equal to the threshold value of "$\delta_{MAX}$", the optical design is assessed at step 232 according to the merit function for the instant value of "d" and the corresponding pivot (roll) angle "δ" of the selected group of surfaces. The calculated merit function value is stored in association with the variable "d". If, in the alternative, the value of pivot (roll) angle "δ" is greater than the threshold value of "$\delta_{MAX}$", the instant value of "d" is excluded at step 234 from consideration according to the merit function.

Both decision pathways from the decision step 230 merge at decision step 236, where a decision is made as to whether to analyze another value for the variable "d" within the set range. The decision can be based on the number or range of values already considered for the value of "d". If another value of the variable "d" is to be analyzed, the instant value of "d" is incremented to a new value and control is returned to step 220 where a corresponding pivot (roll) angle "δ" is calculated based on the new value for "d" and the given values of the other variables "L", "R", "h", and "C".

Once enough values for the variable "d" have been analyzed, the decision step 236 routes control to a comparative step 238 where the analyzed values of the variable "d" can be compared according to their associated merit function values. For example, the values of the merit function can be plotted as a function of the variable "d" and trends such as limited ranges of the variable "d" where the merit function (as a measure of error) approaches a minimum can be identified.

At step 240, a preferred value of the variable "d" is selected based on (a) values that minimize the sensitivity of the system performance to possible misalignments of the considered optical surfaces through the clearance space "C" and (b) values that can be practically incorporated into the considered optical assembly. Finally, at step 242, the selected value of the variable "d" is incorporated into the physical design of the optical assembly as a rotational interface having a center of curvature located along the alignment axis at the distance "d" from the referenced vertex "S1" of the optical component.

The steps 228 through 238 can be performed in various stages of automation including as an optimization routine that converges to a value of the distance "d" at which the merit function is optimized. However, it may also be important to identify a wider range of values for the distance "d" within which the merit function is within acceptable bounds to accommodate other physical constraints of the optical assembly, which might preclude an implementation of the optimum distance "d".

The distance "d" can be replaced any number of surrogate parameters that can be used to define the rotational interface and particularly the location of the center of curvature of the rotational interface within the optical assembly. For example, the distance "d" could be replaced by the radius of curvature of the rotational interface having a predefined relationship to the one or more optical surfaces of the optical component subject to pivoting (rolling) about the center of curvature.

Figure 6:
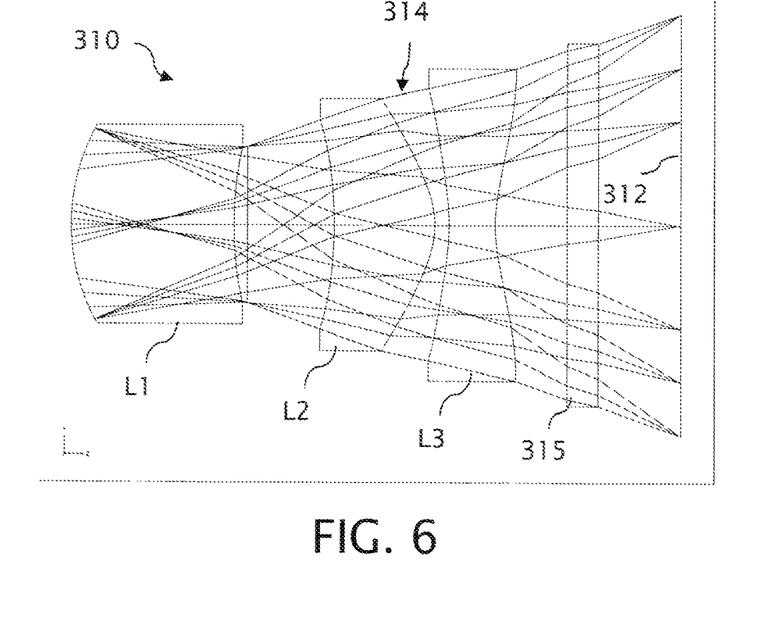
FIG. 6 is a schematic diagram of a set of optical elements for forming an imaging lens with ray tracings to an image plane.

In FIG. 6, a multi-element optical assembly 310, such as may be used for a camera lens, is depicted, including optical elements L1, L2, and L3 that cooperate to form an image at an image plane 312. Various ray tracings 314 are also shown depicting optical pathways through the optical assembly 310 for forming the desired image.

Figure 7:
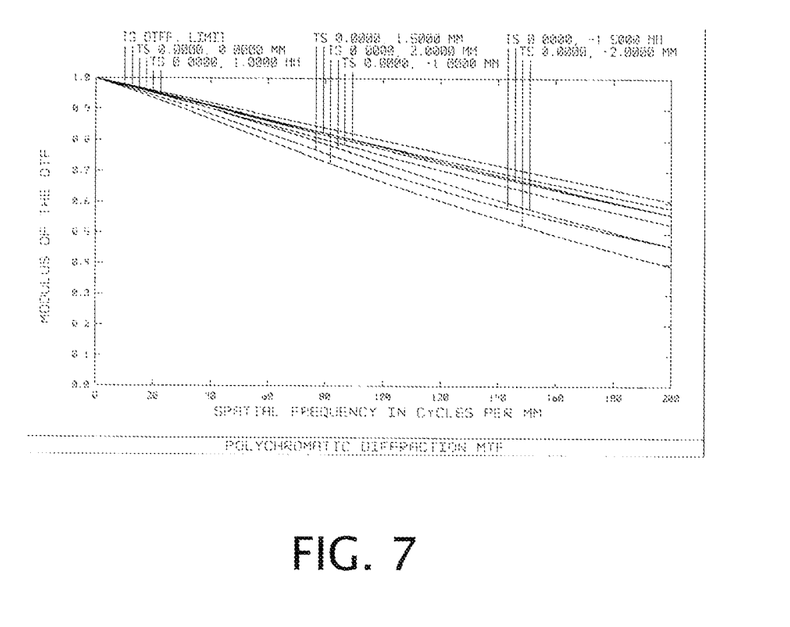
FIG. 7 is a graph plotting a modulus of the optical transfer function of the imaging lens over a domain of spatial frequencies when the optical elements of the lens are aligned according to the optical design.

The graph of FIG. 7 provides an analysis of the optical performance of the optical assembly 310 under optimum conditions in which the optical elements L1, L2, and L3 are oriented and positioned according to the intended optical prescription. The analysis plots the modulus of the optical transfer function (i.e., the MTF) over a domain of spatial frequencies for different points in the optical field. While progressively decreasing with the increase in spatial frequency as expected, the modulation transfer function of the various considered points spreads only gradually for producing good use of the higher spatial frequencies throughout the field.

For purposes of manufacture and assembly of the optical assembly 310, clearance space is provided to accommodate manufacturing tolerances of the optical elements L1, L2, and L3. In accordance with the invention, a further analysis is possible for assessing changes in the optical system performance of the optical assembly 310 associated with the misalignment of the optical elements L1, L2, and L3 through the clearance spaces. Beyond that, the invention also provides for assessing the relative effect on system performance of the misalignments through the clearance spaces at different rotational interfaces with which the optical elements L1, L2, and L3 can be individually or collectively mounted within the optical assembly 310. Here, the optical elements L1, L2, and L3 are arranged in a stack with the element L2 mounted on the element L1, and the element L3 mounted on the element L2. The plano-plate 315 nearest the image plane simulates a sensor cover glass or an infrared blocking filter.

Figure 8:
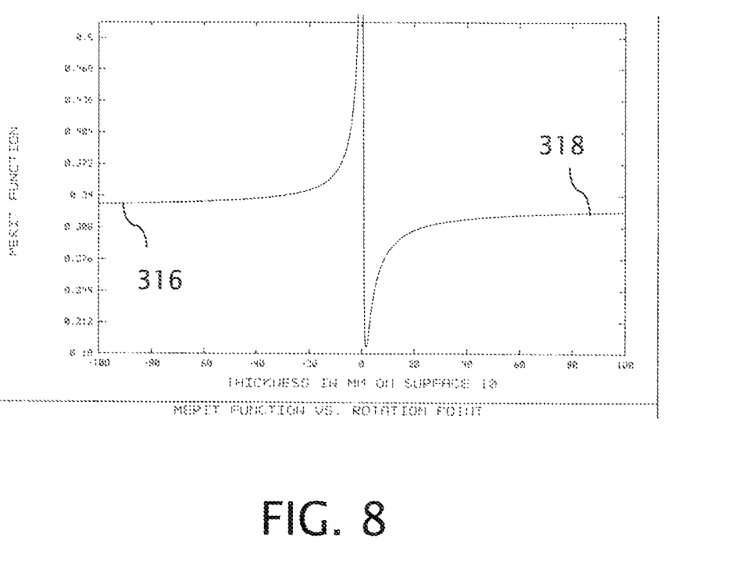
FIG. 8 is a graph plotting a merit function over a domain of different distances at which a center of curvature of the rotational interface can be located for the middle optical element.

FIG. 8 plots a merit function of system performance over a domain of different distances "$d_{L2}$" at which the center of curvature of a rotational interface between the optical element L2 and its optical mount (i.e., the element L1) can be located. All scenarios represented by this plot correspond to a simulated radical clearance space of 0.015 mm. Increases in the merit function as a measure of system error are associated with reductions in optical performance and can be used for comparing the merit function over the different values of "d" as set forth in step 238 of the above-referenced method 210. The two wings 316 and 318 of the graph approach rotational interfaces with infinite radii of curvature, corresponding to the expected optical performance associated with mounting the optical element L2 with a conventional planar interface.

Figure 9:
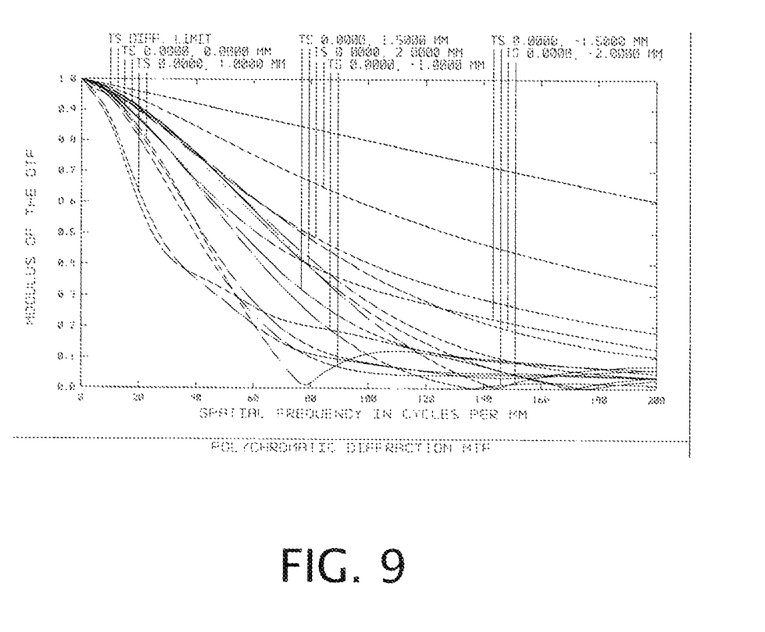
FIG. 9 is a graph plotting the modulus of the optical transfer function of the imaging lens over the domain of spatial frequencies with the middle optical element displaced along a conventional planar interface through a clearance space of 0.025 mm.

FIG. 9 analyzes the expected optical performance of the optical assembly 310 associated with the decentering of the optical element L2 by 0.025 mm at such a conventional planar interface through the tested clearance space. Performance at different points throughout the field drops precipitously with increases in spatial frequency evidencing a greatly reduced capacity of the optical assembly 310 to produce useful images.

Figure 10:
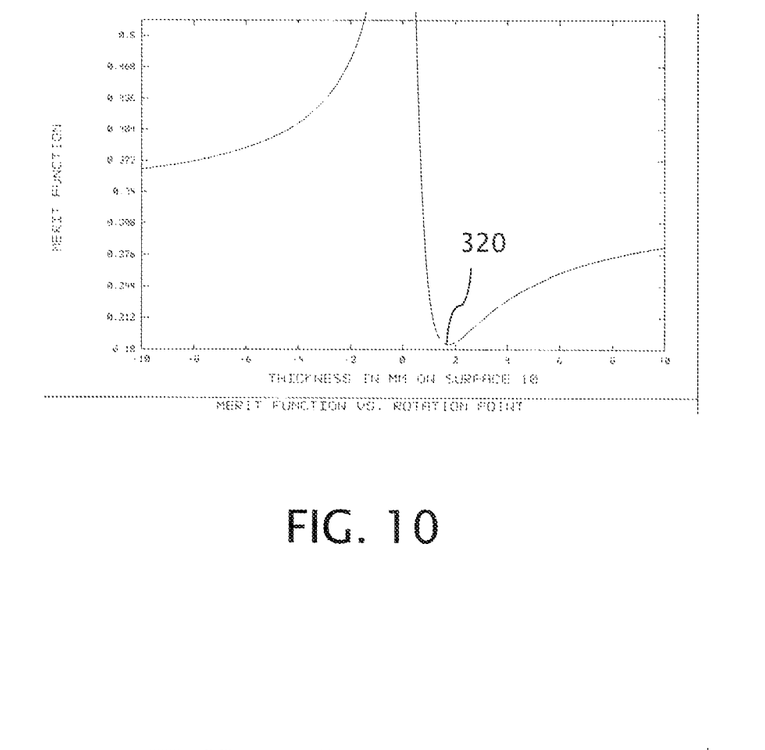
FIG. 10 is an enlarged view of a portion of the graph of FIG. 8 over a more limited domain of distances at which a center of curvature of the rotational interface can be located for showing an optimum region where the merit function approaches a minimum.
Figure 11:
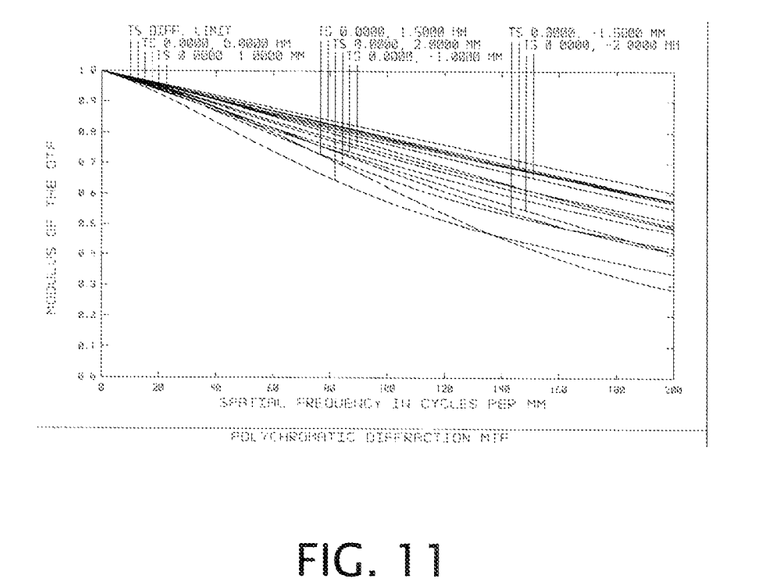
FIG. 11 is a graph plotting the modulus of the optical transfer function of the imaging lens over the domain of spatial frequencies with the middle optical element displaced (pivoted) along a desired rotational interface through a clearance space of 0.025 mm.

A portion of the plot of FIG. 8 is reproduced in FIG. 10 as an expanded view of a limited section of the domain of distance "d" near the origin, showing the plot approaching a minimum at a value of 1.7 mm at the point 320. FIG. 11 provides a more detailed analysis of the misalignment of the optical elements L2 about a center of curvature located at the distance "$d_{L2}$" of 1.7 mm through the same tested clearance space of 0.025 mm. While the depicted optical performance is not quite as good as if the element L2 were aligned properly, the performance is much improved over the performance expected from the displacement of the optical element L2 along a conventional planar interface through the same clearance space. In fact, the plot of FIG. 11 shows that useful images can still be formed even though the optical element L2 is displaced from its proper alignment through the clearance space, if mounted on a rotational interface having its center of curvature located along the alignment axis at the distance "$d_{L2}$".

Figure 12:
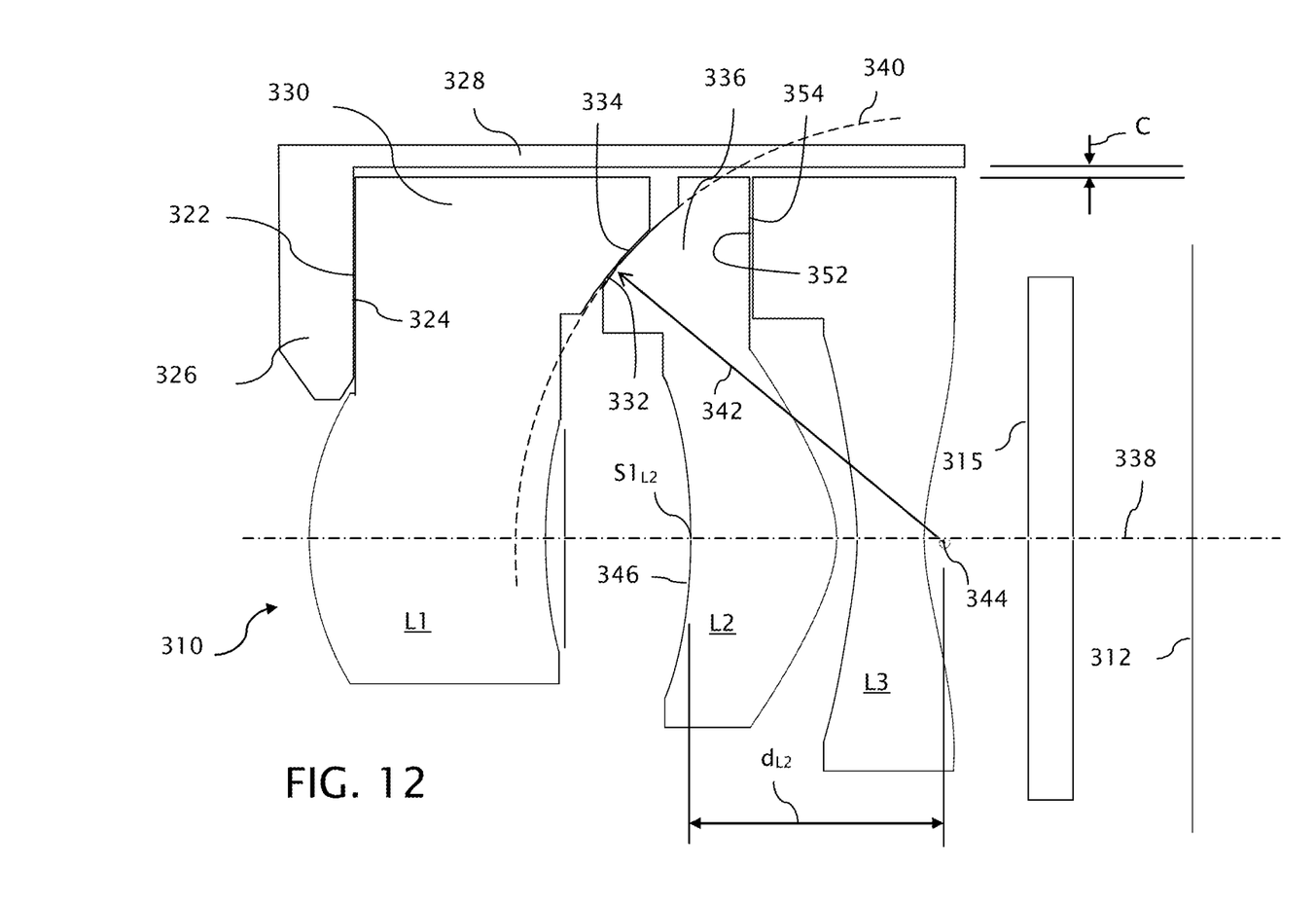
FIG. 12 is a relatively enlarged side view of the imaging lens of FIG. 6 showing mounting structures for optical elements including the desired rotational interface for the middle optical element. Although missing from the bottom half of the drawing for simplicity of illustration, the mounting structures are intended to be rotational symmetric about the illustrated alignment axis.

An implementation of the preferred mounting of the optical element L2 within the optical assembly 310 is depicted in FIG. 12. The optical elements L1, L2, and L3 are arranged in a stack beginning with the optical element L1, which has a planar land 322 mounted against a planar seat 324 of an annular support ring 326 projecting within a barrel-shaped optical mount 328. A mounting zone 330 of the optical element L1 includes, in addition to the planar land 322, a spherical seat 332 for engaging a mating spherical land 334 within a mounting zone 336 of the optical element L2.

The spherical seat 332 of the optical element L1 together with the mating spherical land 334 of the optical element L2 defines a rotational interface 340 having a radius of curvature 342 and a center of curvature 344 located along an alignment axis 338 of the barrel-shaped optical mount 326. The center of curvature 344 is located at the preferred distance "$d_{L2}$" of approximately 1.7 mm to the right of a vertex $S1_{L2}$ on an anterior optical surface 346 of the element L2. It should be noted that this location of a preferred center of curvature is on an opposite side of L2 than that of the centers of curvature of both optical surfaces of L2. This occurrence is significantly unintuitive and is thereby indicative of the usefulness of this inventive method.

Figure 13:
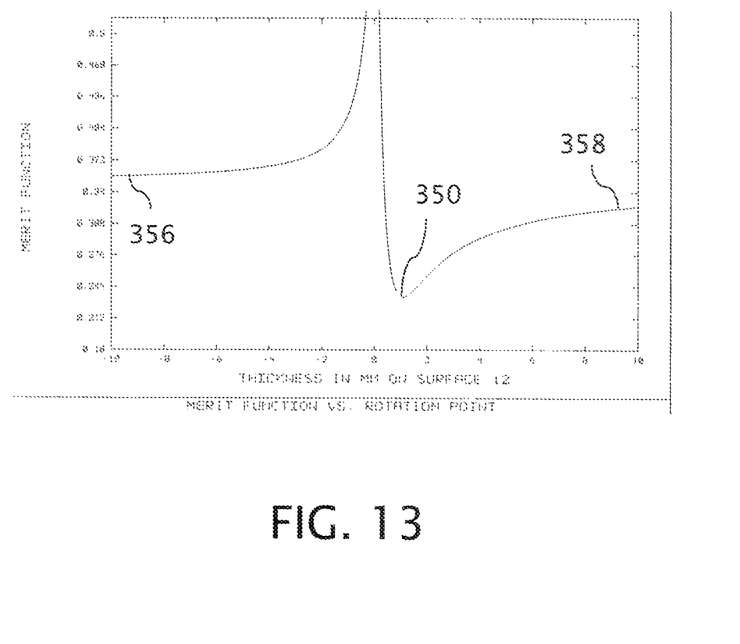
FIG. 13 is a graph plotting a merit function over a domain of different distances at which a center of curvature of the rotational interface can be located for optical element of the imaging lens, scaled for showing an optimum region where the merit function approaches a minimum. This plot is for the element moving to the full extent of a 0.015 mm clearance space for each center of curvature location.
Figure 14:
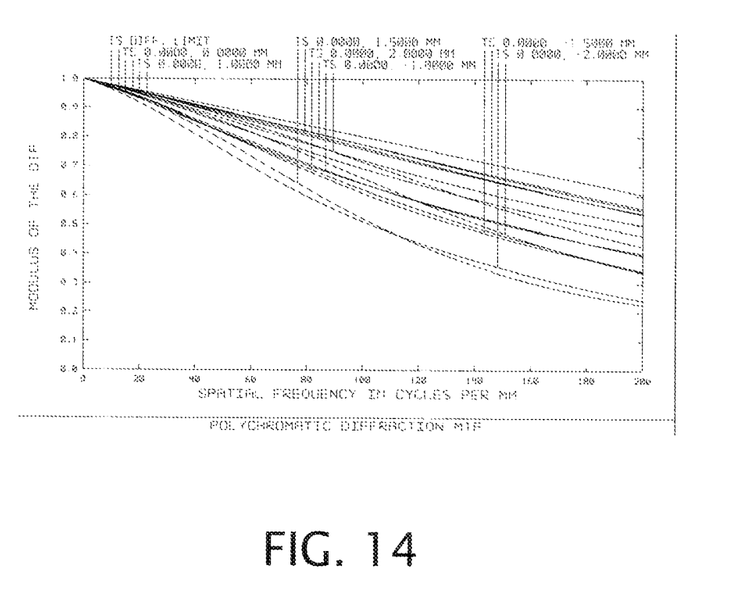
FIG. 14 is a graph plotting the modulus of the optical transfer function of the imaging lens over the domain of spatial frequencies with another of the rearmost optical element displaced (pivoted) along a desired rotational interface through a clearance space of 0.015 mm.

As further shown in FIG. 12, the optical element L3 has a planar land 352 engaged with a planar seat 354 carried within the mounting zone 336 of the optical element L2. However, an independent analysis of the mounting of the optical element L3 as shown in the plot of FIG. 13 shows a minimum merit function at the point 350 corresponding to a distance "$d_{L3}$" of approximately 1.1 mm (to the right of a vertex $S1_{L3}$). This performance is markedly improved over the performance expected from a conventional planar mounting (e.g., the planar land 352 engaging the planar seat 354 of FIG. 12) as approached by the wings 356 and 358 of the plot. FIG. 14 evidences that the performance of the optical assembly 310 remains satisfactory for misalignment of the optical element L3 through the clearance space "C" (0.025 mm), if mounted on a rotational interface having its center of curvature located along the alignment axis at the distance "$d_{L3}$".

Figure 15:
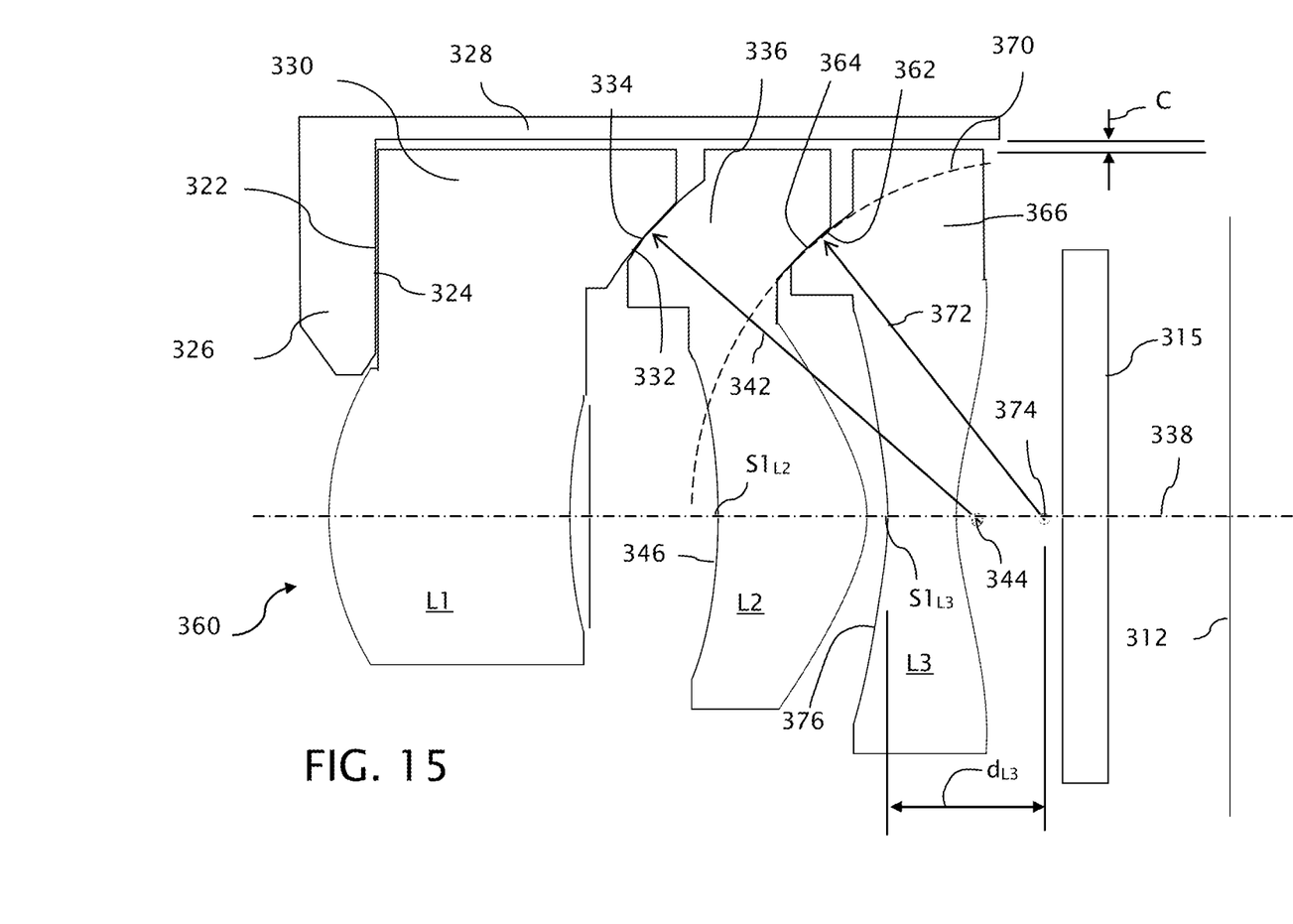
FIG. 15 is a relatively enlarged side view of the imaging lens of FIG. 6 showing mounting structures for optical elements including the two desired rotational interfaces for considered optical elements. Although missing from the bottom half of the drawing for simplicity of illustration, the mounting structures are intended to be rotational symmetric about the illustrated alignment axis.

An optical assembly 360 as a further improvement of the optical assembly 310 is shown in FIG. 15, mounting the optical element L3 in accordance with the above-described analysis identifying the distance "$d_{L3}$" as optimum for defining a rotational interface for the optical element L3 that can best accommodate the required clearance "C". The improved optical assembly 360 of FIG. 15 reuses the reference numerals corresponding to features in common with the optical assembly in FIG. 12.

In the improved optical assembly 360, the optical element L2 has a spherical seat 362 for engaging a mating spherical land 364 within a mounting zone 366 of the optical element L3. The spherical seat 362 of the optical element L2 together with the mating spherical land 364 of the optical element L3 defines a rotational interface 370 having a radius of curvature 372 and a center of curvature 374 located along an alignment axis 338 of the barrel-shaped optical mount 326. The center of curvature 374 is located at the preferred distance "$d_{L3}$" of approximately 1.1 mm to the right of a vertex $S1_{L3}$ on an anterior optical surface 376 of the element L3.

The rotational interface 370 for the optical element L3 can be optimized separately from or together with the optimization of the rotational interface 340 for the underlying optical element L2. For example, a single optimization routine can be run which tests values of both "$d_{L2}$" and "$d_{L3}$" in different combinations having regard for the affect of the pivot (roll) angle for the element L2 on the pivot (roll) angle for the element L3.

The optimization routine can be arranged to converge to optimum values or to identify ranges of values (or a plurality of discrete values) satisfying a threshold for the merit function. Limitations can also be placed on the tested values for the distance "d" or a surrogate parameter defining the rotational interface to accommodate practical limitations of the optical assembly. The identification of acceptable values for the distance "d" or a surrogate parameter can be made automatically or manually, such as by inspection of the plots of FIGS. 10 and 13.

The optimization of the distances "d" or a surrogate parameter can also be carried out in conjunction with other variables of the optical system. Such compound optimizations can also be carried out with various amounts of automation. For example, the values of a particular optical prescription, such as curvature, thickness, and material, can be allowed to vary with one or more distances "d" to reduce misalignment sensitivity of the optical design or to accommodate some other constraint.

The rotational interfaces selected for reducing sensitivity of system optical performance to component misalignment can be implemented in a variety of ways. For example, the seats of the rotational interfaces can be formed in various components of an optical assembly including spacers, retainers, barrels and other mechanically functional components, as well as other optical components. The lands of the rotational interfaces can be formed as a part of the same body as the pivotable optical component or as a part of a separate body such as an adapter to the pivotal component. For example, the mounting zones 336 and 366 of the optical elements L2 and L3 can be formed as parts of the same or different bodies as the optically functional zones of the optical elements L2 and L3. Similarly, the spherical lands 334 and 364 of the elements L2 and L3 can be formed as continuations of the anterior optical surfaces 346 and 376 of the elements (even so far as to define respective aspheric surfaces) or as shown in FIGS. 12 and 15 as discontinuous surfaces. Either way, forming the optical surfaces and spherical lands within a common mold or within another common machining operation allows for the spherical lands to be accurately aligned and otherwise referenced with respect to the optical surfaces.

Figure 16:
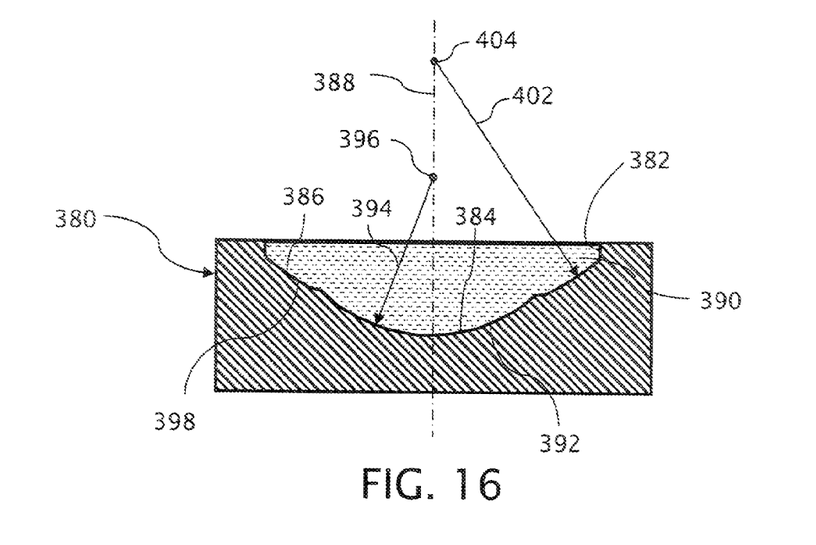
FIG. 16 is a cross-sectional view through a mold member for forming an optical element in accordance with the invention.

For example, a mold member (mold half) 380 as shown in FIG. 16 includes a mold cavity 382 shaped for molding an optical element 390. Within the mold cavity 382 is a first spherical impression 384 for forming an optical surface 392 of the optical element 390 at a radius of curvature 394 extending from a center of curvature 396 and a second spherical impression 386 for forming a spherical land 398 at a radius of curvature 402 extending from a center of curvature 404. In cooperation with a spherical seat (not shown), the spherical land 398 can define a rotational interface (not shown) from the center of curvature 404. Both the optical surface 392 and the spherical land 398 are centered with respect to an axis 388 of the mold member 380.

The rotational interface itself is preferably defined through a locus of points of sliding contact between the land of the optical component and the seat of its mount. In the case of axially symmetric optical components, one or both of the land and seat are preferably formed by an annular sector of a sphere where the other of the land and seat includes a minimum of three points of instantaneous contact. In the case of non-axially-symmetric optical components, the annular sector of a sphere may be replaced in a similar fashion with sections of a cylinder.

Although described with respect to a limited number of embodiments, those of skill in the art will appreciate that the invention can be practiced in other ways within the overall teaching of this invention. For example, the optically functional surfaces are generally expected to be nominally spherical or aspherical having a base radius of curvature at the optical axis but could also include anamorphic or freeform surfaces. Similarly, the optically functional surfaces are generally expected to be refractive surfaces but could also be reflective or diffractive optical surfaces. Overall, the invention is primarily intended for reducing sensitivities of optical imaging system performance to component misalignments within clearance spaces, but can also be used with non-imaging systems useful for performing other functions such as illumination.

The invention claimed is:

1. A method of forming a rotational interface between an optical component and an optical mount of an optical assembly for reducing sensitivity of optical system performance to misalignment of the optical component within the optical assembly comprising steps of:
   creating a mathematically defined model of an optical system for the optical assembly within which the rotational interface between the optical component and the optical mount has a center of curvature about which the optical component is pivotable with respect to the optical mount,
   establishing a merit function to assess the optical system performance of the optical assembly,
   arranging a dimension of the rotational interface as a variable within the model of the optical assembly,
   simulating one or more angular misalignments of the optical component with respect to the optical mount about the center of curvature of the rotational interface,
   evaluating the merit function at the simulated angular misalignments of the optical component for different values of the rotational interface dimension, and
   forming the rotational interface between the optical component and the optical mount such that the rotational interface is dimensioned with an identified value of the rotational interface dimension at which the optical system performance of the optical assembly approaches an optimized condition according to the merit function.

2. The method of claim 1 in which the values of the rotational interface dimension corresponds to locations of the center of curvature of the rotational interface.

3. The method of claim 2 in which the step of arranging the rotational interface dimension as a variable includes allowing the center of curvature to vary along an alignment axis of the optical mount.

4. The method of claim 1 in which the step of simulating one or more angular misalignments of the optical component includes simulating different angular misalignments of the optical component based on the different values of the rotational interface dimension.

5. The method of claim 4 in which the step of simulating different angular misalignments includes basing the different angular misalignments on a clearance constraint that limits the angular misalignment of the optical component with respect to the optical mount about the center of curvature of the rotational interface.

6. The method of claim 5 including a step of adjusting the clearance constraint between the optical component and the optical mount.

7. The method of claim 1 in which the merit function incorporates at least one of a modulation transfer function target, an optical path difference target, and a spot size target.

8. The method of claim 1 in which the merit function incorporates targets and weights for a plurality of parameters that collectively provide an indication of a suitability of the optical system for an intended use.

9. The method of claim 1 in which a prescription of the optical system is optimized together with the rotational interface dimension according to the merit function.

10. The method of claim 1 in which a prescription of the optical system remains fixed for optimizing the rotational interface dimension according to the merit function.

11. The method of claim 1 including a further step of optimizing a prescription of the optical system based on the identified value of the rotational interface dimension, which is selected according to the merit function.

12. A method of forming a rotational interface between an optical component and an optical mount within an optical system comprising steps of:
performing an optimization routine in which different rotational interfaces between an optical component and an optical mount are compared based on a sensitivity of optical system performance to misalignment of the optical component to an alignment axis of the optical mount,
selecting among the different rotational interfaces, a rotational interface at which the sensitivity of the optical system performance to the misalignment of the optical component approaches a minimum amount of the sensitivity, and
forming the rotational interface between the optical component and the optical mount in accordance with the selected rotational interface.

13. The method of claim 12 in which the misalignments of the optical component correspond to angular rotational positions of the optical component about centers of curvature of the rotational interfaces.

14. An optical assembly including the optical component, the optical mount, and the rotational interface between the optical component and the optical mount being formed in accordance with the method of claim 13.

15. The optical assembly of claim 14 in which
a physical clearance constraint is formed in the optical mount that limits an arcuate path of relative motion of the optical component with respect to the optical mount, and
the center of curvature of the rotational interface formed between the optical component and the optical mount is located along the alignment axis in a position at which sensitivity of optical system performance to misalignments of the optical component approaches a minimum.

16. The method of claim 12 in which the different rotational interfaces have centers of curvature that lie along the alignment axis of the optical mount and vary in location along the alignment axis with changes in the rotational interfaces.

17. The method of claim 12 in which the step of performing the optimization routine includes establishing a merit function to assess the sensitivity of optical system performance to the misalignment of the optical component.

18. The method of claim 17 in which the step of performing the optimization routine includes simulating the misalignment of the optical component with respect to the optical mount about the center of curvature of the rotational interface.

19. The method of claim 18 in which the misalignment is simulated as a function of both the location of the center of curvature of the rotational interface and a clearance space through which the optical component can be misaligned.

20. The method of claim 18 in which the step of performing the optimization routine includes evaluating the merit function at the simulated misalignment of the optical component for different values of the rotational interface dimension.

21. The method of claim 12 in which the optimization routine is performed on an optical system having prescription that is fixed except for the rotational interface.

22. The method of claim 12 in which the optimization routine is performed on an optical system having a prescription that is subject to change in addition to the rotational interface.

23. The method of claim 12 in which
the optical component includes an optical zone containing the one or more optically functional surfaces and a mounting zone including a land,
the optical mount includes a seat for engaging the land of the optical component, and
the rotational interface formed between an optical component and an optical mount is at least in part defined by points of sliding contact between the land of the optical component and the seat of the optical mount.

24. The method of claim 23 including a step of molding the optical zone and the mounting zone of the optical element within a common mold so that the one or more optically functional surfaces are aligned with the land.

25. The method of claim 24 in which the land is molded together with one of the optical surfaces as a portion of a common aspheric surface.

\* \* \* \* \*